(12) United States Patent
Yang (10) Patent No.: US 11,886,733 B2
(45) Date of Patent: Jan. 30, 2024

(54) CIRCUIT FOR TESTING A MEMORY AND TEST METHOD THEREOF

(71) Applicant: CHANGXIN MEMORY TECHNOLOGIES, INC., Hefei (CN)

(72) Inventor: Cheng-Jer Yang, Hefei (CN)

(73) Assignee: CHANGXIN MEMORY TECHNOLOGIES, INC., Anhui (CN)

( * ) Notice: Subject to any disclaimer, the term of this patent is extended or adjusted under 35 U.S.C. 154(b) by 218 days.

(21) Appl. No.: 17/510,457

(22) Filed: Oct. 26, 2021

(65) Prior Publication Data

US 2022/0100410 A1 Mar. 31, 2022

Related U.S. Application Data

(63) Continuation of application No. PCT/CN2021/103895, filed on Jun. 30, 2021.

(30) Foreign Application Priority Data

Sep. 28, 2020 (CN) .......................... 202011045466.5

(51) Int. Cl.
*G06F 3/06* (2006.01)

(52) U.S. Cl.
CPC .......... *G06F 3/0653* (2013.01); *G06F 3/0604* (2013.01); *G06F 3/0673* (2013.01)

(58) Field of Classification Search
CPC ..... G06F 3/0653; G06F 3/0604; G06F 3/0673
USPC ........................................................ 365/201
See application file for complete search history.

(56) References Cited

U.S. PATENT DOCUMENTS

| | | | |
|---|---|---|---|
| 5,673,231 A | | 9/1997 | Furutani |
| 5,687,123 A | * | 11/1997 | Hidaka .................. G11C 7/062 |
| | | | 365/189.11 |
| 6,781,897 B2 | | 8/2004 | Dvir |
| 7,440,347 B1 | | 10/2008 | Vogelsang |

(Continued)

FOREIGN PATENT DOCUMENTS

| CN | 101377960 A | 3/2009 |
|---|---|---|
| CN | 100508061 C | 7/2009 |

(Continued)

OTHER PUBLICATIONS

First Office Action of the Chinese application No. 202011045466.5, dated May 27, 2023. 10 pages with English abstract.

*Primary Examiner* — Huan Hoang
(74) *Attorney, Agent, or Firm* — Cooper Legal Group, LLC (57) ABSTRACT

A circuit for testing a memory and a test method thereof are provided. According to the circuit for testing a memory provided by the present disclosure, a switch control circuit is connected between a discharge end and a negative bias signal end of a Sub Wordline Drive (SWD) and configured to input a trigger signal, so that potential of a Word Line (WL) signal end in a to-be-tested circuit meets a preset potential suspension range. Then, it is determined whether there is leakage behavior between the WL signal end and a Bit Line (BL) signal end in the to-be-tested circuit by detecting whether the present level state of a stored signal in the to-be-tested circuit is consistent with an initial level state. The to-be-tested circuit is a corresponding circuit in a single memory.

11 Claims, 3 Drawing Sheets

(56) References Cited

U.S. PATENT DOCUMENTS

| | | | |
|---|---|---|---|
| 8,891,325 B2 * | 11/2014 | Choi | G11C 29/024 |
| | | | 365/203 |
| 2002/0007386 A1 | 1/2002 | Martin | |
| 2004/0042279 A1 | 3/2004 | Oumiya | |
| 2004/0156260 A1 | 8/2004 | Lee | |
| 2006/0120176 A1 | 6/2006 | Schneider | |
| 2009/0046526 A1 | 2/2009 | Lee | |
| 2009/0063918 A1 | 3/2009 | Chen | |
| 2012/0008384 A1 | 1/2012 | Li | |
| 2012/0008410 A1 | 1/2012 | Huynh | |
| 2012/0014197 A1 | 1/2012 | Okuma | |

FOREIGN PATENT DOCUMENTS

| | | | |
|---|---|---|---|
| CN | 102760496 A | 10/2012 | |
| CN | 103069498 A | 4/2013 | |
| JP | 2010287297 A | 12/2010 | |
| KR | 20110059124 A | 6/2011 | |
| TW | 200423149 A | 11/2004 | |

* cited by examiner

CIRCUIT FOR TESTING A MEMORY AND TEST METHOD THEREOF

CROSS-REFERENCE TO RELATED APPLICATIONS

The present application is a continuation of International Patent Application No. PCT/CN2021/103895, filed on Jun. 30, 2021, which is based on and claims priority to Chinese Patent Application No. 202011045466.5, filed to the China National Intellectual Property Administration on Sep. 28, 2020 and entitled "CIRCUIT FOR TESTING A MEMORY AND TEST METHOD THEREOF". The disclosures of International Patent Application No. PCT/CN2021/103895 and Chinese Patent Application No. 202011045466.5 are hereby incorporated by reference in their entireties.

BACKGROUND

As a memory, a Dynamic Random Access Memory (DRAM) may be divided into a fixed non-erasable memory and a volatile memory according to the characteristics of its stored data. Once the information stored in the fixed non-erasable memory is solidified, it will always exist and general users cannot modify it by themselves. On the contrary, the volatile memory is configured to store temporary information generated by a user during use. Once the power is off, the information stored in the memory will disappear accordingly. No matter what kind of memory it is, it is indispensable in the application of computer field.

However, in the memory preparation process, there are some uncontrollable factors in the process, such as temperature and humidity problems during production, or shorting of a Word Line (WL) and a Bit Line (BL) caused by an abnormal process, etc., which will cause leakage behavior between a WL signal end and a BL signal end. During normal use of the memory, such leakage behavior will prevent the normal writing and reading of data and cause great harm to its normal operation.

SUMMARY

The present disclosure relates to the technical field of computers, and in particular to a circuit for testing a memory and a test method thereof.

In a first aspect, the present disclosure provides a circuit for testing a memory, which include a switch control circuit. The switch control circuit may be configured to input a trigger signal for triggering the potential of the WL signal end in a to-be-tested circuit to meet a preset potential suspension range. The switch control circuit is connected between a discharge end and a negative bias signal end of a Sub Wordline Drive (SWD), and the to-be-tested circuit is a corresponding circuit in a single memory.

In a second aspect, the present disclosure provides a method for testing a memory, which is applied to any circuit for testing a memory related to the first aspect and an optional solution of the first aspect. The method may include the following operations. A to-be-tested circuit is initialized, so that a stored signal of the to-be-tested circuit and voltage value of a BL signal end meet a preset test condition. The to-be-tested circuit is a corresponding circuit in a single memory. A trigger signal is input through a switch control circuit for triggering the potential of a WL signal end in the to-be-tested circuit to meet a preset potential suspension range. If it is detected that a present level state of the stored signal is inconsistent with an initial level state within preset time length, it is determined whether there is leakage behavior between the WL signal end and the BL signal end in the to-be-tested circuit.

DETAILED DESCRIPTION

Exemplary embodiments will now be illustrated in detail, and examples thereof are illustrated in the accompanying drawings. When the following description refers to the accompanying drawings, unless otherwise indicated, like numerals in different drawings indicate the same or similar elements. The implementations described in the following exemplary embodiments do not represent all implementations consistent with the present disclosure. Rather, they are merely examples of methods and devices consistent with some aspects of the present disclosure as described in detail in the appended claims.

Terms "first", "second", "third", "fourth", etc., (if any), in the specification, claims, and drawings of the present disclosure are adopted not to describe a specific sequence or order but to distinguish similar objects. It is to be understood that data used like this may be interchanged as appropriate such that the embodiments of the present disclosure described here may be implemented, for example, according to sequences in addition to those illustrated or described here. In addition, terms "include" and "have" and any transformations thereof are intended to cover nonexclusive inclusions. For example, a process, method, system, product, or device including a series of steps or units is not limited to the steps or units that are clearly listed but may include other steps or units that are not clearly listed or intrinsic to the process, the method, the product, or the device.

As a memory, the dynamic random access memory is indispensable in the present disclosure of the computer field. However, in the memory preparation process, there are some uncontrollable factors in the preparation process, which may cause the leakage behavior between the WL signal end and the BL signal end of the prepared memory. Such leakage behavior may prevent the normal writing and reading of the data in the memory. It may be seen that the leakage behavior between the WL signal end and the BL signal end may cause great harm to the normal operation of the memory.

It is apparent that there is an urgent need for a solution to the possible leakage behavior of the memory.

The embodiment of the present disclosure provides a circuit for testing a memory and a test method thereof. A switch control circuit is connected between a discharge end and a negative bias signal end of an SWD, and a trigger signal is input through the switch control circuit for triggering potential of a WL signal end in a to-be-tested circuit to meet a preset potential suspension range. If it is detected that the present level state of the stored signal is inconsistent with an initial level state within preset time length, it is determined that there is leakage behavior between the WL signal end and the BL signal end in the to-be-tested circuit. Herein, the to-be-tested circuit is the corresponding circuit in a single memory. Thereby, the leakage behavior between the WL signal end and the BL signal end of the single memory is determined through the switch control circuit, and then an abnormal memory unit with the leakage behavior is detected. In addition, the test circuit provided by the embodiment of the present disclosure has a simple structure, and the test method is easy to realize, has high universality, and is conducive to application to actual detection working conditions.

Exemplary application scenarios of the embodiment of the present disclosure will be described below.

Figure 1:
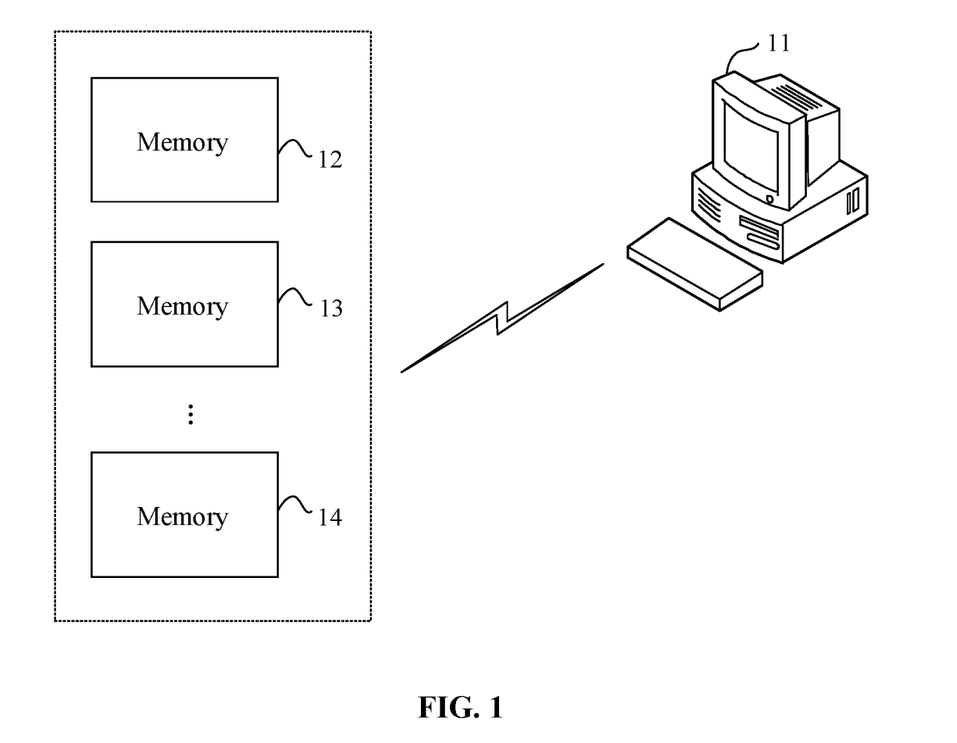
FIG. 1 is a schematic diagram of an application scenario according to an embodiment of the present disclosure.

The method for testing a memory provided by the embodiment of the present disclosure may be applied to the circuit for testing a memory provided by the embodiment of the present disclosure. FIG. 1 is a schematic diagram of an application scenario provided by an embodiment of the present disclosure. As illustrated in FIG. 1, the method for testing a memory provided by the embodiment of the present disclosure may be implemented by a configured electronic device 11, and a circuit corresponding to a memory 12 is tested, thereby detecting an abnormal memory. The method for testing a memory provided by the embodiment of the present disclosure is configured to test a single memory, but in actual working conditions, a plurality of memories may be correspondingly configured, such as a memory 13 and a memory 14 according to the quantity of data to be stored in the memory. Therefore, the method for testing a memory provided by the embodiment of the present disclosure is employed for the corresponding circuit in each of the plurality of memories to detect the abnormal memory. It is to be noted that only partial memories are illustrated in FIG. 1, and the number of memories is not limited in the embodiments of the present disclosure. Moreover, the electronic device 11 may be a part or cluster of a server, a computer, a notebook computer, etc., and the computer is taken as an example in FIG. 1.

It is to be noted that the foregoing application scenarios are merely schematic, and the circuit for testing a memory and the test method provided by the embodiment of the present disclosure include but are not limited to the foregoing application scenarios.

The technical solutions of the present disclosure and how the technical solutions of the present disclosure solve the above technical problems will be illustrated below in detail with specific embodiments. The following specific embodiments may be combined with each other, and the same or similar concepts or processes may not be repeated in some embodiments. The embodiments of the present disclosure will now be described in combination with the accompanying drawings.

Figure 2:
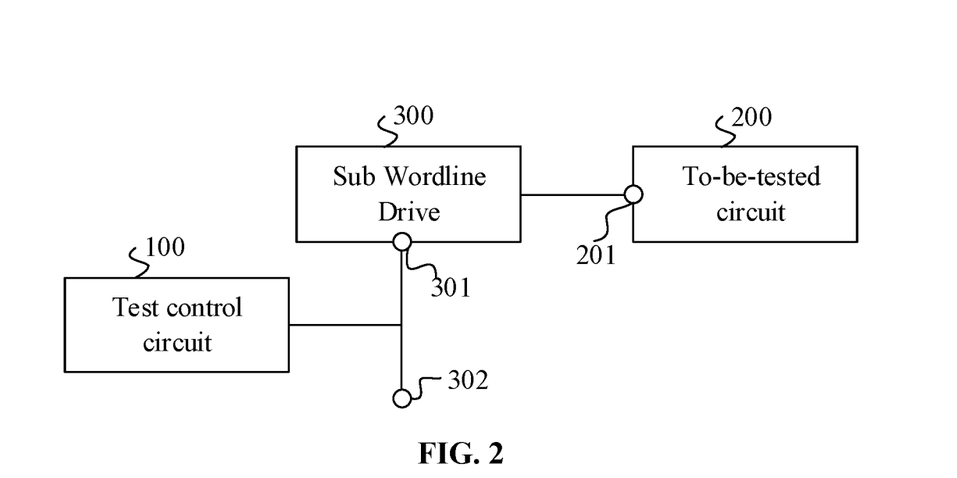
FIG. 2 is a structural diagram of a circuit for testing a memory according to an embodiment of the present disclosure.

FIG. 2 is a schematic diagram of a circuit for testing a memory according to an embodiment of the present disclosure. As illustrated in FIG. 2, the circuit for testing a memory provided by the embodiment includes a switch control circuit 100.

The switch control circuit 100 may be configured to input a trigger signal for triggering the potential of a WL signal end in a to-be-tested circuit 200 to meet a preset potential suspension range.

The switch control circuit 100 is connected between a discharge end 301 and a negative bias signal end 302 of an SWD 300, and the to-be-tested circuit 200 is a corresponding circuit in a single memory.

Figure 4:
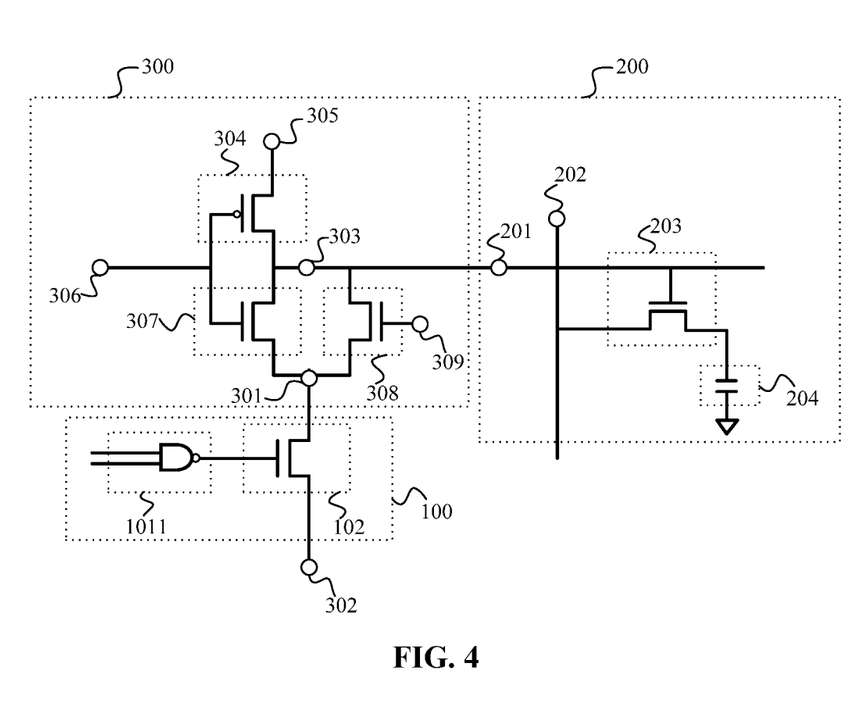
FIG. 4 is a schematic diagram of yet another circuit for testing a memory according to an embodiment of the present disclosure.
Figure 5:
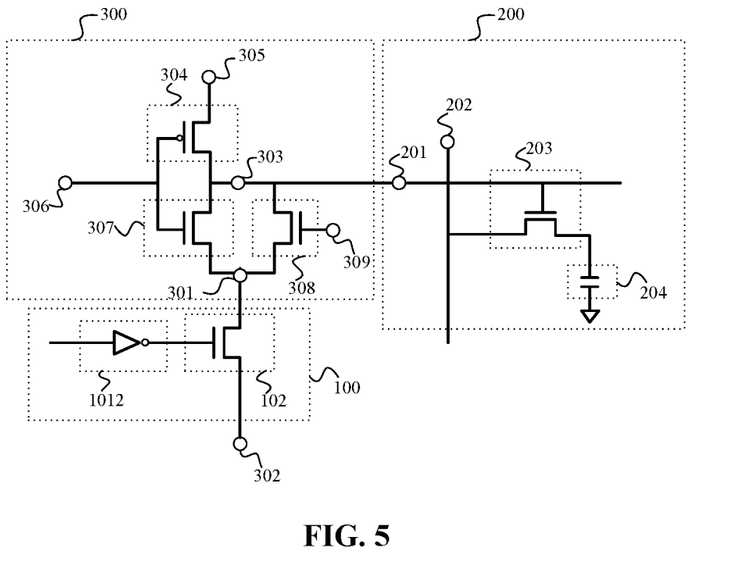
FIG. 5 is a schematic diagram of still another circuit for testing a memory according to an embodiment of the present disclosure.

Referring to FIG. 2, the switch control circuit 100 is connected between the discharge end 301 and the negative bias signal end 302 of the SWD 300. The switch control circuit 100 is configured to input the trigger signal. After the trigger signal is input, the negative bias signal end 302 and the SWD 300 are disconnected, so that a BL signal end 202 (as shown in FIG. 4 or FIG. 5) of the to-be-tested circuit 200 is in an off state and the WL signal end 201 is in a suspension state, that is, the potential of the WL signal end 201 reaches the preset potential suspension range through the input trigger signal. It is to be understood that the preset potential suspension range is any state between a high level and a low level, which is not limited by the embodiment of the present disclosure.

Due to the fact that the BL signal end 202 (as shown in FIG. 4 or FIG. 5) is in the off state, before the trigger signal is input through the switch control circuit 100, the to-be-tested circuit 200 is precharged through a preset charging circuit, so that the voltage value of the BL signal end 202 reaches preset voltage value. For example, the preset voltage value may be half the Peak-to-peak value (Vdd) corresponding to a transistor in the to-be-tested circuit 200. When the trigger signal is input through the switch control circuit 100 so that the BL signal end 202 is in the off state, the voltage value on the BL signal end 202 may always remain unchanged at the preset voltage value. At this time, if there is no leakage behavior in the to-be-tested circuit 200, the level state of the stored signal of the to-be-tested circuit 200 will remain consistent with the initial level state without changing. Rather, if there is leakage behavior in the to-be-tested circuit 200, it is equivalent to forming a path with high resistance R between the WL signal end 201 and the BL signal end 202. At this time, due to the fact that the BL signal end 202 is in the off state, the level state of the stored signal may change due to the existence of the high resistance R path. Therefore, after the trigger signal is input through the switch control circuit 100, whether the present level state of the stored signal of the to-be-tested circuit 200 is consistent with the initial level state is detected within the preset time length, so that it may be determined whether there is the leakage behavior in the to-be-tested circuit 200. If there is leakage behavior, the memory corresponding to the to-be-tested circuit 200 is an abnormal memory, thus detecting the abnormal memory. In addition, due to the memory structure, when the to-be-tested circuit 200 has the leakage behavior, there is leakage behavior between the WL signal end 201 and the BL signal end 202 of the to-be-tested circuit 200. For example, there may be a total short circuit or a partial short circuit between them.

The preset time length is the maximum time length for detecting the level state of the stored signal at intervals. For example, the preset time length may be 64 ms. However, in actual working conditions, for the accuracy of the test, the present level state of the stored signal may be read in a time interval less than the preset time length. For example, the preset time length may be any time length between 10 ms and 30 ms.

The circuit for testing a memory provided by the embodiment of the present disclosure includes the switch control circuit, which is connected between the discharge end and the negative bias signal end of the SWD and configured to input the trigger signal for triggering the potential of the WL signal end in the to-be-tested circuit to meet the preset potential suspension range. It is determined whether there is leakage behavior between the WL signal end and the BL signal end of the to-be-tested circuit based on the trigger signal input by the switch control circuit. If there is the leakage behavior, the memory corresponding to the to-be-tested circuit is the abnormal memory, thus detecting the abnormal memory. The circuit for testing a memory provided by the embodiment provides a favorable solution for detecting the abnormal memory with the leakage behavior through the switch control circuit with a simple structure, has high universality, and is conducive to be widely applied to actual detection conditions.

Figure 3:
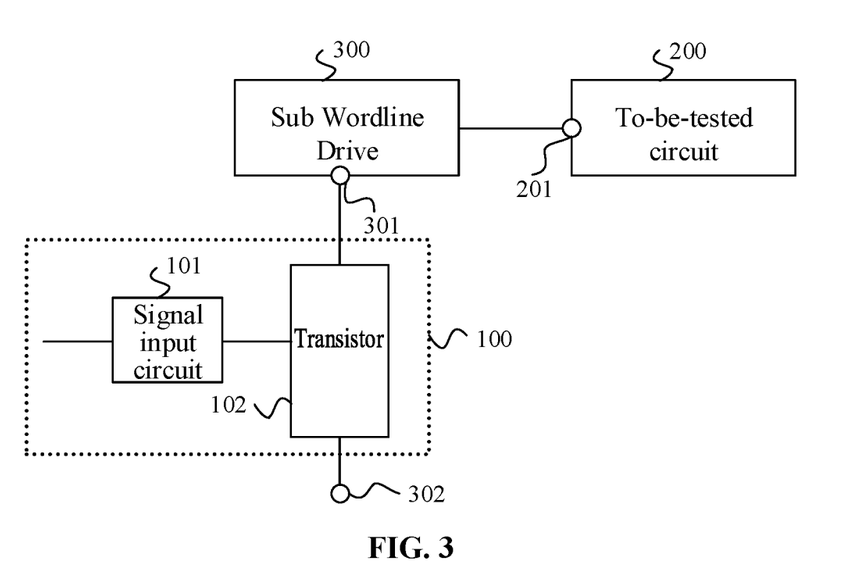
FIG. 3 is a structural diagram of another circuit for testing a memory according to an embodiment of the present disclosure.

On the basis of the embodiment illustrated in FIG. 2, FIG. 3 is a structural diagram of another circuit for testing a memory according to an embodiment of the present disclosure. As illustrated in FIG. 3, a switch control circuit 100 in a circuit for testing a memory provided by the embodiment of the present disclosure includes a signal input circuit 101 and a transistor 102.

A first end of the transistor 102 is connected with a discharge end 301, a second end of the transistor 102 is connected with a negative bias signal end 302, and a control end of the transistor 102 is connected with the output end of the signal input circuit 101.

Referring to FIG. 3, the switch control circuit 100 includes the signal input circuit 101 and the transistor 102. The connection relationship between the signal input circuit 101 and the transistor 102 may be that the first end of the transistor 102 is connected with the discharge end 301 of an SWD 300, the second end of the transistor 102 is connected with the negative bias signal end 302 of the SWD 300, and the control end of the transistor 102 is connected with the output end of the signal input circuit 101. An input end of the signal input circuit 101 is configured to input a trigger signal to be input by the switch control circuit 100.

The transistor 102 may be configured as an N-type Metal-Oxide-Semiconductor (NMOS) transistor to control the conduction direction of the trigger signal input by the signal input circuit. For example, after the trigger signal is input through the input end of the signal input circuit 101, the transistor 102 may be in an off state, which may disconnect the negative bias signal end 302 from the SWD 300, so that the BL signal end 202 (as shown in FIG. 4 or FIG. 5) of the to-be-tested circuit 200 may be in an off state, and the potential of the WL signal end 201 may reach a suspension state, so as to meet a preset potential suspension range.

In a possible design, the signal input circuit 101 may be configured as a NAND gate element 1011 or an inverter 1012.

According to the circuit for testing a memory and the test method thereof provided in the present disclosure, the switch control circuit is connected between a discharge end and a negative bias signal end of an SWD, and is configured to input the trigger signal for triggering the potential of the WL signal end in the to-be-tested circuit to meet the preset potential suspension range. If it is detected that the present level state of the stored signal is inconsistent with the initial level state within the preset time length, it is determined that there is the leakage behavior between the WL signal end and the BL signal end in the to-be-tested circuit. Herein, the to-be-tested circuit is the corresponding circuit in the single memory. Thereby, it is determined that there is leakage behavior between the WL signal end and the BL signal end of the to-be-tested circuit through the switch control circuit, and then an abnormal memory is detected. The circuit for testing a memory provided by the present disclosure is simple in structure, and the test method is easy to implement, thus providing a favorable solution for detecting the abnormal memory with the leakage behavior.

FIG. 4 is a schematic diagram of yet another circuit for testing a memory provided by the embodiment of the present disclosure. As illustrated in FIG. 4, a signal input circuit 101 in the circuit for testing a memory provided by the embodiment may be a NAND gate element 1011. Herein, an output end of the NAND gate element 1011 is connected with a control end of a transistor 102, and two input ends of the NAND gate element 1011 respectively input an Address Signal (RA) (此处全称不确定) and a trigger signal. Specifically, a first input end of the NAND gate element 1011 is configured to input the RA, and a second input end of the NAND gate element 1011 is configured to input the trigger signal. It is to be understood that in the control process of the circuit, the RA is configured to specify the input position of the signal, so as to input the corresponding control signal according to the preset input end. Herein, the RA may be a high level. It is to be understood that the RA may also be input through other elements in actual working conditions, and input elements of the RA in the embodiment of the present disclosure include but are not limited to this.

FIG. 5 is a schematic diagram of still another circuit for testing a memory according to the embodiment of the present disclosure. As illustrated in FIG. 5, a signal input circuit 101 in the circuit for testing a memory provided by the embodiment may be an inverter 1012. An output end of the inverter 1012 is connected with a control end of a transistor 102, an input end of the inverter 1012 is configured to input a trigger signal, and thus the trigger signal is conducted through the control end of the transistor 102.

Referring back to FIG. 4 or FIG. 5, in a possible design, the SWD 300 in the circuit for testing a memory provided by the embodiment of the present disclosure may be configured to provide a drive signal for the to-be-tested circuit 200. The drive signal may be provided for the to-be-tested circuit 200 through the SWD 300, so that the level state of the stored signal of the to-be-tested circuit 200 may be at a low level or at a high level, and then the memory corresponding to the to-be-tested circuit 200 conducts normal data writing and reading. Specifically, the drive signal is a drive voltage signal.

The connection between the SWD 300 and each part of the to-be-tested circuit 200 may be that a drive signal output end 303 of the SWD 300 is connected with a WL signal end 201 of the to-be-tested circuit 200, and a negative bias signal end 302 of the SWD 300 is connected with a control end of a transistor 203 in the to-be-tested circuit 200. It is to be understood that in the schematic diagrams illustrated in FIGS. 4-5, in order to present the diagrams clearly, the negative bias signal end 302 is not connected with the control end of the transistor 203. In actual working conditions, the negative bias signal end 302 is connected with the control end of the transistor 203 in the to-be-tested circuit 200, to control the transistor 203 to be turned off by a negative bias signal input from the negative bias signal end 302, so that the charge stored in a capacitor in the to-be-tested circuit 200 is saved.

It is to be noted that constituent elements such as the transistor 102 included in the signal input circuit in the switch control circuit 100 in the embodiment of the present disclosure are merely exemplary, and other alternative circuits may also be employed in the case of achieving the same effect.

The switch control circuit included in the circuit for testing a memory provided by the embodiment of the present disclosure may include the switch control circuit and the transistor. The signal input circuit may be the NAND gate element or the inverter. If the signal input circuit is the NAND gate element, the output end of the NAND gate element is connected with a control end of a turn-off transistor, and the first input end and the second input end of the NAND gate element are respectively configured to input the address signal (RA) and the trigger signal. Similarly, if the signal input circuit is the inverter, the output end of the inverter is connected with the control end of the transistor, and the input end of the inverter is configured to input the trigger signal. Therefore, on the basis of the trigger signal input by the NAND gate element or the inverter and a switch control function of the transistor, the trigger signal is input, and then it is determined whether there is leakage behavior between the WL signal end and the BL signal end of the to-be-tested circuit. The circuit for testing a memory provided by the embodiment provides a favorable solution for detecting the abnormal memory with leakage behavior, has high universality, and is conducive to being applied to actual detection conditions.

Referring back to FIG. 4 or FIG. 5, in a possible design, the SWD 300 in the circuit for testing a memory provided by the embodiment of the present disclosure further includes a P-channel Metal Oxide Semiconductor (PMOS) transistor 304, a first NMOS transistor 307 and a second NMOS transistor 308.

A first end of the PMOS transistor 304 is connected with a first WL selection signal (FTX) end 305, a second end of the PMOS transistor 304 is connected with a drive signal output end 303 and connected with the WL signal end 201, and a control end of the PMOS transistor 304 is connected with a drive signal input end 306.

A first end of the first NMOS transistor 307 is connected with the drive signal output end 303, a second end of the first NMOS transistor 307 is connected with the discharge end 301, and a control end of the first NMOS transistor 307 is connected with the drive signal input end 306.

A first end of the second NMOS transistor 308 is connected with the discharge end 301, a second end of the second NMOS transistor 308 is connected with the WL signal end 201, and a control end of the second NMOS transistor 308 is connected with a second WL selection signal (FXB) end 309.

Referring to the contents illustrated in FIG. 4 or FIG. 5 and as described in the above embodiment, the SWD 300 includes two NMOS transistors and a PMOS transistor as well as two WL selection signal ends, a drive voltage signal input end, a drive voltage signal output end, the negative bias signal end and the discharge end. The two NMOS transistors are respectively a first NMOS transistor 307 and a second NMOS transistor 308, which are in a parallel state. The first NMOS transistor 307 herein is in a series state with the PMOS transistor 304. The end, connected in parallel with the second NMOS transistor 308, of the first NMOS transistor 307 is connected with the drive signal output end 303, and then connected to the WL signal end 201 of the to-be-tested circuit 200, and the other end thereof serves as the discharge end 301 to be connected with the first end of the transistor 102 in the switch control circuit 100. In addition, the control end of the second NMOS transistor 308 is connected with the second WL selection signal end 309. The first end of the PMOS transistor 304 is connected with the first WL selection signal (FTX) end 305, the second end is connected with the drive signal output end 303 and connected with the first end of the first NMOS transistor 307 to form a series state. The control end of the PMOS transistor 304 is connected with the control end of the first NMOS transistor 307 and connected with the drive signal input end 306, so as to input a drive signal.

Furthermore, referring back to the to-be-tested circuit 200 illustrated in FIG. 4 or FIG. 5, the to-be-tested circuit 200 in the circuit for testing a memory provided by the embodiment of the present disclosure further comprises a capacitor 204.

Specifically, a first end of the capacitor 204 is connected with the first end of the transistor 203 in the to-be-tested circuit 200, and a second end of the capacitor 204 is grounded.

The second end of the transistor 203 in the to-be-tested circuit 200 is connected with the BL signal end 202, and the control end of the transistor 203 in the to-be-tested circuit 200 is connected with the WL signal end 201.

When the transistor 203 is controlled to be on, the voltage on the BL signal end 202 may charge the capacitor 204.

It is to be understood that the composition of each element in the SWD 300 and the to-be-tested circuit 200 in the embodiment of the present disclosure and the connection relationship between them are merely exemplary, and any other alternative circuit may also be employed in the case of achieving the same effect. In addition, the to-be-tested circuit 200 in the circuit for testing a memory provided by the embodiment of the present disclosure is a corresponding circuit in a single memory. Herein, the corresponding circuit in the single memory at least includes the capacitor 204, the transistor 203, and the corresponding WL signal end 201 and BL signal end 202.

Figure 6:
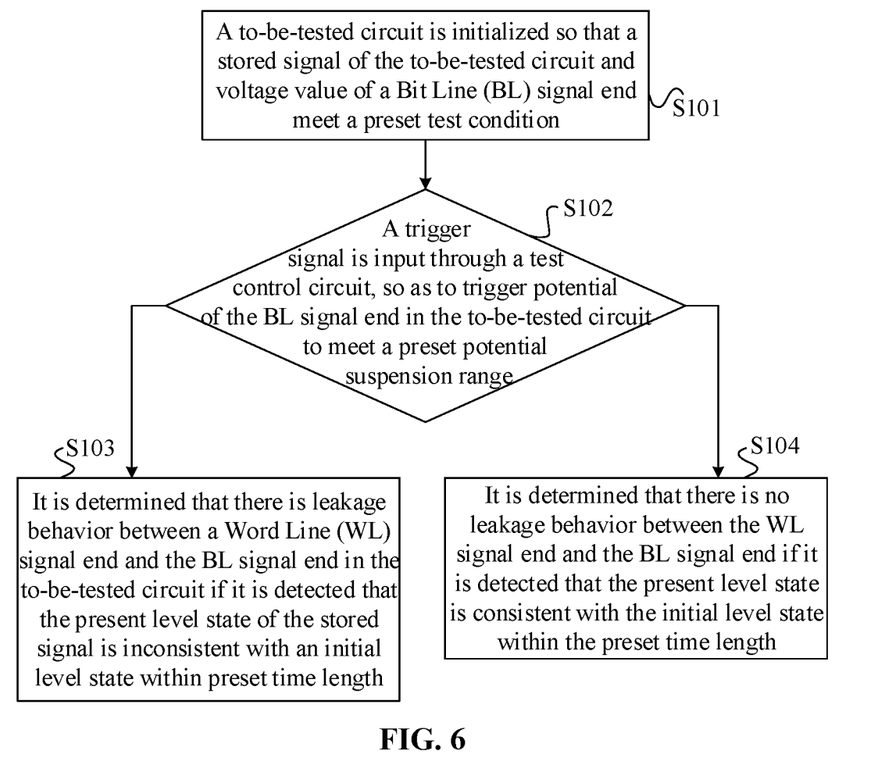
FIG. 6 is a flow diagram of a method for testing a memory according to an embodiment of the present disclosure.

Based on the circuit for testing a memory in the above embodiment, the embodiment of the present disclosure also provides a method for testing a memory. FIG. 6 is a flow diagram of a method for testing a memory according to an embodiment of the present disclosure. As illustrated in FIG. 6, the method for testing a memory provided by the embodiment includes the following operations.

In S101, a to-be-tested circuit is initialized, so that a stored signal of the to-be-tested circuit and voltage value of a BL signal end meet a preset test condition.

The to-be-tested circuit is a corresponding circuit in a single memory.

The method for testing a memory provided by the embodiment of the present disclosure is applied to the circuit for testing a memory provided by the embodiment of the present disclosure. The method for testing a memory provided by the embodiment of the present disclosure may be implemented in particular by a correspondingly configured electronic control element, which may be an electronic device in the embodiment illustrated in FIG. 1.

Before being tested, the to-be-tested circuit is first initialized, so that the stored signal of the to-be-tested circuit and the voltage value of the BL signal end meet the preset test condition.

For example, the stored signal of the to-be-tested circuit is first initialized so that the initial level state of the stored signal is at a low level or at a high level. Specifically, for the memory corresponding to the to-be-tested circuit, when the initial level state of the initialized storage signal is at the low level, that is, all-0 background signals are written, and when the initial level state of the initialized storage signal is at the high level, all-1 background signals are written. Then, the to-be-tested circuit is precharged through a preset charging circuit, so that the voltage value of the BL signal end reaches the preset voltage value. The preset voltage value may be half the Vdd corresponding to the transistor in the to-be-tested circuit. The specific value of the preset voltage value may be set according to the actual working conditions, which is not limited by the embodiment of the present disclosure. It is to be understood that the preset test condition in the above embodiment is the initial level state of the stored signal and the preset voltage value of the BL signal end.

It is to be understood that the objective of initializing the to-be-tested circuit so that the stored signal and the voltage value of the BL signal end of the to-be-tested circuit meet the preset test condition is to cause the to-be-tested circuit in a to-be-tested state, thereby improving the accuracy of the test method.

In S102, the trigger signal is input through the switch control circuit for triggering the potential of the WL signal end in the to-be-tested circuit to meet a preset potential suspension range.

The trigger signal is input through the switch control circuit so that the potential of the work line signal end reaches the preset potential suspension range. The preset potential suspension range may be understood as any state between the high level and the low level.

The objective of the switch control circuit is to input the trigger signal, and when the trigger signal is input, the negative bias signal end and the SWD may be disconnected, so that the BL signal end is in an off state, and then the WL signal end is in a suspension state, in other words, the potential of the WL signal end meets the preset potential suspension range.

Due to the fact that the to-be-tested circuit is initialized, the voltage value of the BL signal end meets the preset test condition. For example, the voltage value reaches the preset voltage value. At this time, after the trigger signal is input, the potential of the WL signal end in the to-be-tested circuit meets the preset potential suspension range, the BL signal end may be in the off state, and the voltage value on the BL signal end remains unchanged. If there is no leakage behavior in the to-be-tested circuit, the level state of the stored signal of the to-be-tested circuit may remain consistent with the initial level state without changing. Rather, if there is leakage behavior in the to-be-tested circuit, it is equivalent to forming a path with high resistance R between the WL signal end and the BL signal end. Since the BL signal end is in the off state, the level state of the stored signal is changed due to the existence of the high resistance R path.

Therefore, after the trigger signal is input through the switch control circuit, only by detecting whether the initial level state of the stored signal changes or not, can it be determined whether the to-be-tested circuit has the leakage behavior.

In S103, if it is detected that the present level state of the stored signal is inconsistent with the initial level state within preset time length, it is determined that there is the leakage behavior between the WL signal end and the BL signal end in the to-be-tested circuit.

In S104, if it is detected that the present level state is consistent with the initial level state within the preset time length, it is determined that there is no leakage behavior between the WL signal end and the BL signal end.

After the potential on the BL signal end in the to-be-tested circuit is triggered by the trigger signal to meet the preset potential suspension range, it is only necessary to detect whether the initial level state of the stored signal has changed within the preset time length to determine whether there is the leakage behavior in the to-be-tested circuit. In other words, it is detected whether the present level state of the stored signal is consistent with the initial level state within the preset time length. The present level state is the level state of the stored signal after the potential of the WL signal end meets the preset potential suspension range.

If it is read that the present level state is inconsistent with the initial level state within the preset time length, that is, the initial level state has changed, it may be determined that there is leakage behavior in the to-be-tested circuit, and there is the leakage behavior of full or partial short circuit between the WL signal end and the BL signal end.

Rather, if it is read that the present level state is consistent with the initial level state within the preset time length, that is, the initial level state has not changed, it may be determined that there is no leakage behavior in the to-be-tested circuit, and there is no leakage behavior between the WL signal end and the BL signal end.

It is to be noted that the preset time length is the maximum time length for reading the level state of the stored signal at intervals. For example, the preset time length may be 64 ms. However, in actual working conditions, for the accuracy of the test, the present level state of the stored signal may be read in a time interval less than the preset time length. For example, the preset time length may be any time length between 10 ms and 30 ms.

So far, whether there is the leakage behavior in the to-be-tested circuit or not is detected based on the switch control circuit. Further, the memory corresponding to the to-be-tested circuit with the leakage behavior is an abnormal memory, thus realizing effective detection of the abnormal memory.

The method for testing a memory provided by the embodiment of the present disclosure is applied to the circuit for testing a memory provided by the embodiment of the present disclosure. According to the method for testing a memory provided by the embodiment of the present disclosure, the to-be-tested circuit is initialized, so that the stored signal of the to-be-tested circuit and the voltage value of the BL signal end meet the preset test condition. The to-be-tested circuit is the corresponding circuit in the single memory. Then, the trigger signal is input through the switch control circuit for triggering the potential of the WL signal end in the to-be-tested circuit to meet the preset potential suspension range. And it is detected whether there is the leakage behavior between the WL signal end and the BL signal end in the to-be-tested circuit by detecting whether the present level state of the stored signal is consistent with the initial level state within the preset time length. If they are inconsistent, it is determined that there is the leakage behavior; otherwise, if they are consistent, there is no leakage behavior. The memory corresponding to the to-be-tested circuit with the leakage behavior is the abnormal memory. Thus, the leakage behavior between the WL signal end and the BL signal end of the to-be-tested circuit is determined through the switch control circuit, and then the abnormal memory is detected. The switch control circuit with a simple structure is employed so that a favorable solution is provided for detecting the abnormal memory with the leakage behavior. The test method is easy to implement, has high universality, and is conducive to being widely applied to actual detection conditions.

Furthermore, the switch control circuit in the circuit for testing a memory provided by the embodiment of the present disclosure may include the signal input circuit and the transistor.

For example, after the trigger signal is input through the signal input circuit, the transistor may be in an off state, and therefore the negative bias signal end and the SWD may be disconnected, so that the BL signal end of the to-be-tested circuit may be in an off state, and the potential of the WL signal end may be in a suspension state to meet the preset potential suspension range.

In a possible design, if the signal input circuit is configured as a NAND gate element, a possible implementation of S102 may be that an RA is input through a first input of the NAND gate element and a trigger signal is input through a second input of the NAND gate element.

In another possible design, if the signal input circuit is configured as an inverter, a possible implementation of S102 may be that the trigger signal is directly input through an input end of the inverter.

In a possible design, whether the signal input circuit in the switch control circuit is configured as the NAND gate element or the inverter, the input trigger signal may be a high level.

When the method for testing a memory provided by the embodiment of the present disclosure is applied to the circuit for testing a memory, the switch control circuit may include the signal input circuit and the transistor. The signal input circuit is configured as the NAND gate element or the inverter. Particularly, if the signal input circuit is the NAND gate element, when the trigger signal is input through the switch control circuit, the RA may be input through a first input end of the NAND gate element and the trigger signal may be input through a second input end of the NAND gate element. Particularly, if the signal input circuit is configured as the inverter, when the trigger signal is input through the switch control circuit, the trigger signal may be input through the input end of the inverter. The trigger signals input by both signal input circuits may be a high level. Thus, on the basis of the trigger signal input by the NAND gate element or the inverter and a switch control function of the transistor, input of the trigger signal is realized, so that the potential of the WL signal end in the to-be-tested circuit meets the preset potential suspension range. And then it is detected whether there is the leakage behavior between the WL signal end and the BL signal end in the to-be-tested circuit by detecting whether the present level state of the stored signal has changed or not. The method for testing a memory provided by the embodiment is easy to implement, provides a favorable solution for detecting the abnormal memory with the leakage behavior, has high universality, and is conducive to be widely applied to actual detection conditions.

Other embodiments of the present disclosure will be apparent to those skilled in the art after consideration of the specification and practice of the disclosure disclosed here. The present application is intended to cover any variations, uses, or adaptations of the present disclosure, and the variations, uses, or adaptations follow the general principles of the present disclosure and include common general knowledge or conventional technical means in the art undisclosed by the present disclosure. The specification and embodiments are considered as examples only, and a true scope and spirit of the present disclosure are indicated by the following claims.

It is to be understood that the present disclosure is not limited to the exact construction that has been described above and illustrated in the accompanying drawings, and that various modifications and changes can be made without departing from the scope thereof. The scope of the present disclosure is only limited by the appended claims.

The invention claimed is:

1. A circuit for testing a memory, comprising:
    a switch control circuit, configured to input a trigger signal for triggering potential of a Word Line (WL) signal end in a to-be-tested circuit to meet a preset potential suspension range,
    wherein the switch control circuit is connected between a discharge end and a negative bias signal end of a Sub Wordline Drive (SWD), and the to-be-tested circuit is a corresponding circuit in a single memory;
    wherein the switch control circuit comprises: a signal input circuit and a transistor;
    wherein a first end of the transistor is connected with the discharge end, a second end of the transistor is connected with the negative bias signal end, and a control end of the transistor is connected with an output end of the signal input circuit;
    wherein the signal input circuit is a NAND gate element, an output end of the NAND gate element is connected with the control end of the transistor, a first input end of the NAND gate element is configured to input an Address Signal (RA), and a second input end of the NAND gate element is configured to input the trigger signal.

2. The circuit for testing a memory of claim 1, wherein the transistor is an N-type Metal-Oxide-Semiconductor (NMOS) transistor.

3. The circuit for testing a memory of claim 2, wherein a drive signal output end of the SWD is connected with the WL signal end of the to-be-tested circuit, the negative bias signal end is connected with the control end of the transistor in the to-be-tested circuit, and the SWD is configured to provide a drive signal for the to-be-tested circuit.

4. The circuit for testing a memory of claim 3, wherein the SWD further comprises:
    a P-channel Metal Oxide Semiconductor (PMOS) transistor, a first end of the PMOS transistor being connected with a First WL Selection Signal (FTX) end, a second end of the PMOS transistor being connected with the drive signal output end, and a control end of the PMOS transistor being connected with a drive signal input end;
    a first NMOS transistor, a first end of the first NMOS transistor being connected with the drive signal output end, a second end of the first NMOS transistor being connected with the discharge end, and a control end of the first NMOS transistor being connected with the drive signal input end; and
    a second NMOS transistor, a first end of the second NMOS transistor being connected with the discharge end, a second end of the second NMOS transistor being connected with the WL signal end, and a control end of the second NMOS transistor being connected with a second WL selection signal end.

5. The circuit for testing a memory of claim 4, wherein the to-be-tested circuit further comprises a capacitor,
    a first end of the capacitor is connected with the first end of the transistor in the to-be-tested circuit, and a second end of the capacitor is grounded,
    wherein the second end of the transistor in the to-be-tested circuit is connected with the WL signal end, and the control end of the transistor in the to-be-tested circuit is connected with the WL signal end.

6. A method for testing a memory, applied to a circuit for testing a memory comprising a switch control circuit, the switch control circuit being connected between a discharge end and a negative bias signal end of a Sub Wordline Drive (SWD), the method comprising:
    initializing a to-be-tested circuit, so that a stored signal of the to-be-tested circuit and voltage value of a Bit Line (BL) signal end meet a preset test condition, the to-be-tested circuit being a corresponding circuit in a single memory;

inputting a trigger signal through the switch control circuit to trigger potential of a Word Line (WL) signal end in the to-be-tested circuit to meet a preset potential suspension range; and determining that there is leakage behavior between the WL signal end and the BL signal end in the to-be-tested circuit when it is detected that a present level state of the stored signal is inconsistent with an initial level state within preset time length.

7. The method for testing a memory of claim 6, wherein it is determined that there is no leakage behavior between the WL signal end and the BL signal end in the to-be-tested circuit when it is detected that the present level state is consistent with the initial level state within the preset time length.

8. The method for testing a memory of claim 7, wherein initialing the to-be-tested circuit, so that the stored signal of the to-be-tested circuit and the voltage value of the BL signal end meet the preset test condition comprises:

initializing the stored signal, so that the initial level state of the stored signal is at a low level or at a high level; and precharging the to-be-tested circuit through a precharging circuit, so that the voltage value of the BL signal end meets a preset voltage value, the preset test condition comprising the initial level state and the preset voltage value.

9. The method for testing a memory of claim 8, wherein the switch control circuit comprises a signal input circuit and a transistor;

wherein inputting the trigger signal through the switch control circuit to trigger the potential of the WL signal end in the to-be-tested circuit to meet the preset potential suspension range comprises:

inputting the trigger signal through the signal input circuit, so that the transistor is in an off state.

10. The method for testing a memory of claim 9, wherein when the signal input circuit is a NAND gate element, an Address Signal (RA) is input through a first input end of the NAND gate element, and the trigger signal is input through a second input end of the NAND gate element; or when the signal input circuit is an inverter, the trigger signal is input through an input end of the inverter.

11. The method for testing a memory of claim 10, wherein the trigger signal is the high level.

* * * * *